(12) United States Patent
Fallows et al.

(10) Patent No.: US 12,412,002 B2
(45) Date of Patent: Sep. 9, 2025

(54) SYSTEMS AND METHODS FOR ADDING A DESIGN ELEMENT TO A DESIGN

(71) Applicant: Canva Pty Ltd, Surry Hills (AU)

(72) Inventors: Marc Fallows, Sunrise Beach (AU); Danny Wu, Sydney (AU); Shannon Michael Rothe, Redfern (AU); Katherine Nicole Zorz, Meadowbank (AU); Melanie Joy Perkins, Surry Hills (AU); Andrew Francis Argente Freeman, Waterways (AU)

(73) Assignee: Canva Pty Ltd, Surry Hills (AU)

( * ) Notice: Subject to any disclaimer, the term of this patent is extended or adjusted under 35 U.S.C. 154(b) by 282 days.

(21) Appl. No.: 17/994,376

(22) Filed: Nov. 27, 2022

(65) Prior Publication Data

US 2023/0205939 A1 Jun. 29, 2023

(30) Foreign Application Priority Data

Dec. 3, 2021 (AU) .................................. 2021903926

(51) Int. Cl.
*G06F 30/12* (2020.01)
(52) U.S. Cl.
CPC .................... *G06F 30/12* (2020.01)

(58) Field of Classification Search
CPC ....................................................... G06F 30/12
USPC ........................................................ 716/139
See application file for complete search history.

(56) References Cited

U.S. PATENT DOCUMENTS

| 9,639,969 B1 | 5/2017 | Wilson et al. |
| 2017/0220206 A1* | 8/2017 | Horn ................... G06F 16/9038 |
| 2018/0181551 A1 | 6/2018 | Cooperman |
| 2018/0329621 A1 | 11/2018 | Sonnino et al. |

FOREIGN PATENT DOCUMENTS

WO 2021155438 A1 8/2021

OTHER PUBLICATIONS

Examination Report No. 1 for Australian Patent Application No. 2022275402 mailed on Oct. 11, 2023, pp. 1-5.

* cited by examiner

*Primary Examiner* — Eric D Lee
(74) *Attorney, Agent, or Firm* — GrowIP Law Group LLC

(57) ABSTRACT

Described herein is a computer implemented method for adding an element to a design. The method includes displaying a design canvas and, in response to detecting an insert element user interaction, displaying a quick-add GUI. Text query data is received via the quick-add GUI and a submit query user interaction is detected. In response to determining that the submit query user interaction is associated with an add defined element command, a first design element that is associated with the add defined element command is added to the design.

20 Claims, 6 Drawing Sheets

SYSTEMS AND METHODS FOR ADDING A DESIGN ELEMENT TO A DESIGN

CROSS-REFERENCE TO RELATED APPLICATION

This application is a U.S. Non-Provisional application that claims priority to Australian Patent Application No. 2021903926, filed Dec. 3, 2021, which is hereby incorporated by reference in its entirety.

TECHNICAL FIELD

Aspects of the present disclosure are directed to systems and methods for adding a design element to a design.

BACKGROUND

Various computer implemented tools for creating, editing, and publishing designs exist.

Typically, a given design tool provides various types of design elements, various ways for adding design elements to a design (or a design page), and—once added to a page—various ways to manipulate and modify an element.

Background information described in this specification is background information known to the inventors. Reference to this information as background information is not an acknowledgment or suggestion that this background information is prior art or is common general knowledge to a person of ordinary skill in the art.

SUMMARY

Described herein is a computer implemented method for adding an element to a design, the method including: displaying a design canvas; detecting an insert element user interaction; in response to detecting the insert element user interaction, displaying a quick-add graphical user interface (GUI), the quick-add GUI including an input field; receiving text query data via the input field; detecting a submit query user interaction; determining whether the submit query user interaction is associated with an add defined element command, the add defined element command being associated with a first design element; and in response to determining that the submit query user interaction is associated with the add defined element command, adding the first design element to the design.

Figure 1:
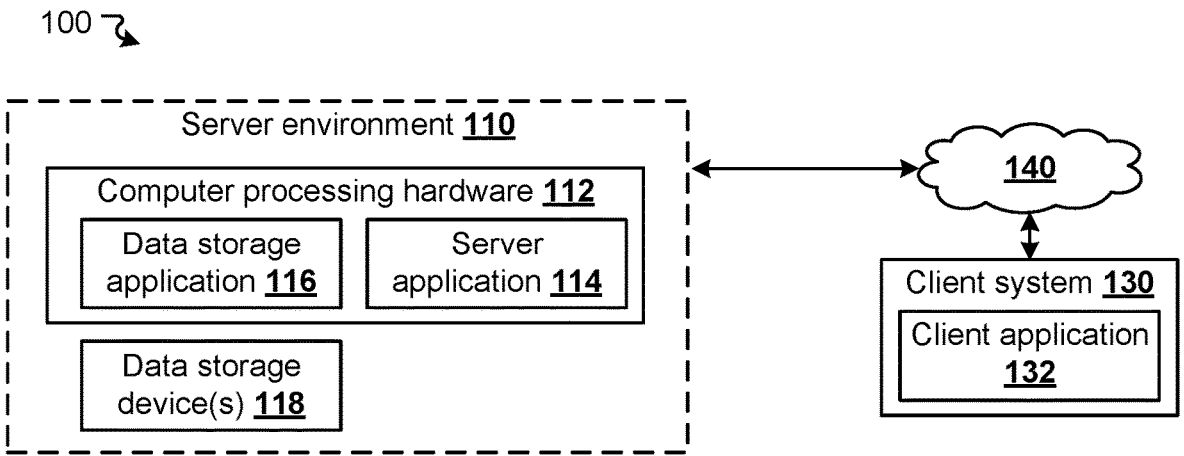
FIG. 1 is a diagram depicting a networked environment in which various features of the present disclosure may be implemented.

While the description is amenable to various modifications and alternative forms, specific embodiments are shown by way of example in the drawings and are described in detail. It should be understood, however, that the drawings and detailed description are not intended to limit the invention to the particular form disclosed. The intention is to cover all modifications, equivalents, and alternatives falling within the scope of the present invention as defined by the appended claims.

DETAILED DESCRIPTION

In the following description numerous specific details are set forth in order to provide a thorough understanding of the present invention. It will be apparent, however, that the present invention may be practiced without these specific details. In some instances, well-known structures and devices are shown in block diagram form in order to avoid unnecessary obscuring.

Design creation tools can provide a huge array of options that enable users to search for design elements, add design elements to a design, and manipulate design elements once added to a design. Providing such flexibility is advantageous as it allows users to create complex and intricate designs. On the other hand, there may be times when a user wants a simple and straight forward mechanism for adding a design element to a design. Additionally, or alternatively, users may enjoy discovering and using alternative user interface mechanisms for adding elements to a design.

The present disclosure provides what will be referred to as a quick-add mechanism for adding elements to a design. The quick-add mechanism is provided by a design platform. In the present embodiments, the design platform is provided by a client server architecture such as that shown in networked environment 100 of FIG. 1.

Networked environment 100 includes a server environment 110 and a client system 130 which communicate via one or more communications networks 140 (e.g. the Internet).

Generally speaking, server environment 110 includes computer processing hardware 112 (discussed below) on which one or more applications that provide server-side functionality to client applications (such as client application 132 described below) execute. In the present example, the computer processing hardware 112 of the server environment 110 runs a server application 114 (which may also be referred to as a front end server application) and a data storage application 116.

Server application 114 operates to provide a client application endpoint that is accessible over communications network 140. To do so, server application 114 may include one or more application programs, libraries, APIs or other software elements that implement the features and functions that are described herein. For example, where server application 114 serves web browser client applications the server application 114 will be a web server which receives and responds to, for example, HTTP application protocol requests. Where server application 114 serves native client applications, server application 114 will be an application server configured to receive, process, and respond to API calls from those client applications The server environment 110 may include both web server and application server applications allowing it to interact with both web and native client applications.

In addition to the specific functionality described herein, the server application 114 (alone or in conjunction with other applications) may provide additional functions that are typically provided by server systems—for example user account creation and management, user authentication, and/or other server side functions.

Data storage application 116 operates to receive and process requests to persistently store and retrieve data that is relevant to the operations performed/services provided by the server environment 110. Such requests may be received from the server application 114, other server environment applications, and/or (in some instances) directly from client applications such as 132. Data relevant to the operations performed/services provided by the server environment may include, for example, user account data, design data (i.e. data describing designs that have been created by users), design data in respect of designs that have been created by users of the platform, design assets, and/or other data relevant to the operation of the server application 114. Design assets may be stored in one or more libraries and may include, for example, various types of assets that users can search for (e.g. via search control 316 described below) and use to create designs. Such assets may include, for example, design elements (such as photographs, graphics, videos, icons, stickers, geometric shapes, logos, and/or other types of design elements), design templates, predefined styles (or formatting schemes), and/or other assets.

The data storage application 116 may, for example, be a relational database management application or an alternative application for storing and retrieving data from data storage 118. Data storage application 116 stores data to and retrieves data from one or more non transient (or persistent) data storage devices 118—e.g. non-transient computer readable storage devices such as hard disks, solid state drives, tape drives, or alternative computer readable storage devices.

In server environment 110, server application 114 persistently stores data to data storage device 118 via the data storage application 116. In alternative implementations, however, the server application 114 may be configured to directly interact with data storage devices such as 118 to store and retrieve data (in which case a separate data storage application may not be needed). Furthermore, while a single data storage application 116 is described, server environment 110 may include multiple data storage applications. For example one data storage application 116 may be used for user data, another for design data, and one or more further data storage applications 116 used for design element data. In this case, each data storage application may interface with one or more shared data storage devices 118 and/or one or more dedicated data storage devices 118, and each data storage application may receive/respond to requests from various server-side and/or client-side applications (including, for example server application 114).

As noted, the server application 114 and data storage application 116 run on (or are executed by) computer processing hardware 112. Computer processing hardware 112 includes one or more computer processing systems. The precise number and nature of those systems will depend on the architecture of the server environment 110.

For example, in one implementation a single server application 114 runs on its own computer processing system and a single data storage application 116 runs on a separate computer processing system. In another implementation, a single server application 114 and a single data storage application 116 run on a common computer processing system. In yet another implementation, server environment 110 may include multiple server applications running in parallel (on one or multiple computer processing systems).

In a further implementation, server environment 110 is a scalable environment in which application instances (and the computer processing hardware 112—i.e. the specific computer processing systems required to run those instances) are commissioned and decommissioned according to demand—e.g. in a public or private cloud-type system. In this case, server environment 110 may simultaneously run multiple server applications 114 and/or multiple data storage applications 116 (on one or multiple computer processing systems) as required by client demand. Where sever environment 110 is a scalable system it will include additional applications to those illustrated and described. As one example, the server environment 110 may include a load balancing application which operates to determine demand, direct client traffic to the appropriate server application instance 114 (where multiple server applications 114 have been commissioned), trigger the commissioning of additional server environment applications (and/or computer processing systems to run those applications) if required to meet the current demand, and/or trigger the decommissioning of server environment applications (and computer processing systems) if they are not functioning correctly and/or are not required for current demand.

Communication between the applications and computer processing systems of the server environment 110 may be by any appropriate means, for example direct communication or networked communication over one or more local area networks, wide area networks, and/or public networks (with a secure logical overlay, such as a VPN, if required).

The present disclosure describes various operations that are performed by applications of the server environment 110. Generally speaking, however, operations described as being performed by a particular application (e.g. server application 114) could be performed by one or more alternative applications, and/or operations described as being performed by multiple separate applications could in some instances be performed by a single application.

Client system 130 hosts a client application 132 which, when executed by the client system 130, configures the client system 132 to provide client-side functionality/interact with sever environment 110 (or, more specifically, the server application 114 and/or other application provided by the server environment 110). Via the client application 132, a user can perform various operations such as creating, editing, saving, retrieving/accessing, publishing, and sharing documents. Such operations may be performed solely by client application 132, or may involve the client application 132 communicating with the server environment 110 for processing to be performed there (e.g. by the server application 114).

The client application 132 may be a general web browser application which accesses the server application 114 via an appropriate uniform resource locator (URL) and communicates with the server application 114 via general world-wide-web protocols (e.g. http, https, ftp). Alternatively, the client application 132 may be a native application programmed to communicate with server application 114 using defined application programming interface (API) calls.

A given client system such as 130 may have more than one client application 132 installed and executing thereon. For example, a client system 130 may have a (or multiple) general web browser application(s) and a native client application.

The techniques and operations described herein are performed by one or more computer processing systems.

By way of example, client system 130 may be any computer processing system which is configured (or configurable) by hardware and/or software to offer client-side functionality. A client system 130 may be a desktop computer, laptop computers, tablet computing device, mobile/smart phone, or other appropriate computer processing system.

Similarly, the applications of server environment 110 are also executed by one or more computer processing systems. Server environment computer processing systems will typically be server systems, though again may be any appropriate computer processing systems.

Figure 2:
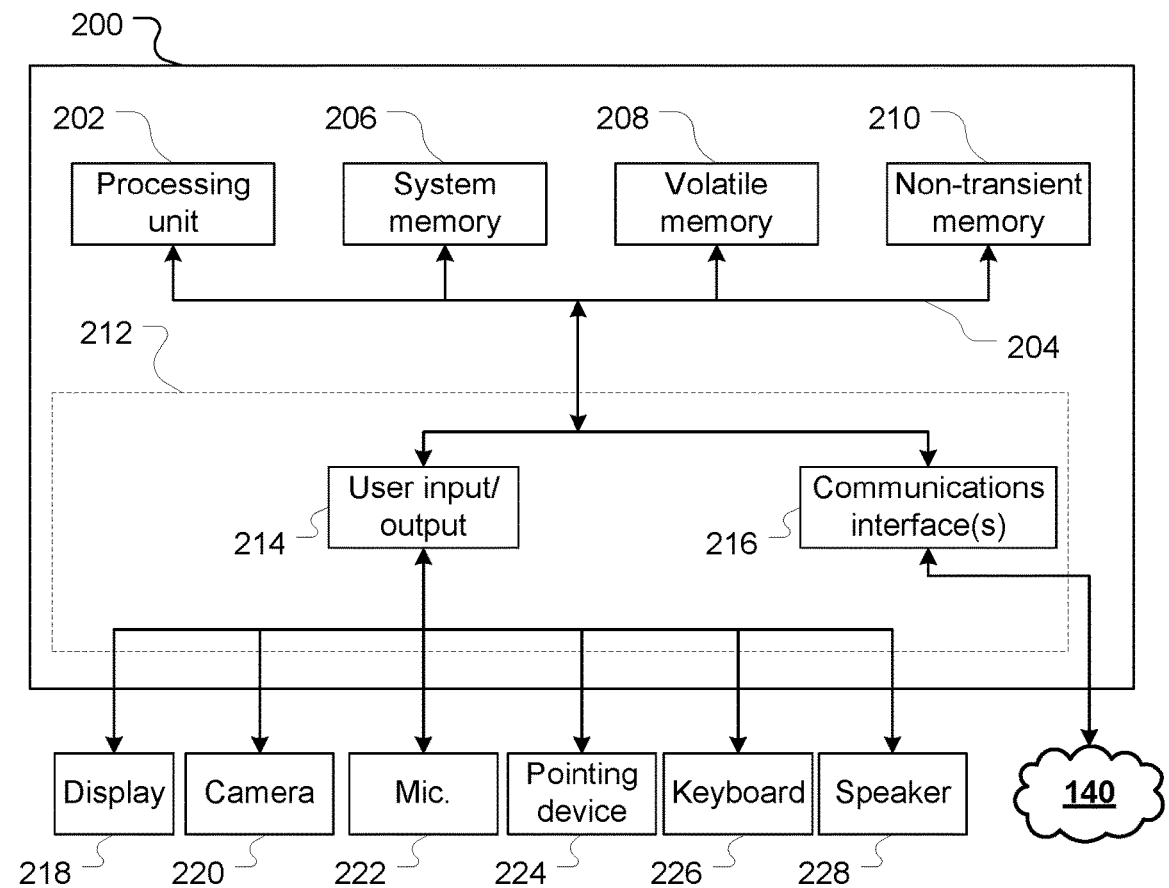
FIG. 2 is a block diagram of a computer processing system configurable to perform various features of the present disclosure.

FIG. 2 provides a block diagram of a computer processing system 200 configurable to implement embodiments and/or features described herein. System 200 is a general purpose computer processing system. It will be appreciated that FIG. 2 does not illustrate all functional or physical components of a computer processing system. For example, no power supply or power supply interface has been depicted, however system 200 will either carry a power supply or be configured for connection to a power supply (or both). It will also be appreciated that the particular type of computer processing system will determine the appropriate hardware and architecture, and alternative computer processing systems suitable for implementing features of the present disclosure may have additional, alternative, or fewer components than those depicted.

Computer processing system 200 includes at least one processing unit 202. The processing unit 202 may be a single computer processing device (e.g. a central processing unit, graphics processing unit, or other computational device), or may include a plurality of computer processing devices. In some instances, where a computer processing system 200 is described as performing an operation or function all processing required to perform that operation or function will be performed by processing unit 202. In other instances, processing required to perform that operation or function may also be performed by remote processing devices accessible to and useable by (either in a shared or dedicated manner) system 200.

Through a communications bus 204 the processing unit 202 is in data communication with a one or more machine readable storage (memory) devices which store computer readable instructions and/or data which are executed by the processing unit 202 to control operation of the processing system 200. In this example system 200 includes a system memory 206 (e.g. a BIOS), volatile memory 208 (e.g. random access memory such as one or more DRAM modules), and non-transient memory 210 (e.g. one or more hard disk or solid state drives).

System 200 also includes one or more interfaces, indicated generally by 212, via which system 200 interfaces with various devices and/or networks. Generally speaking, other devices may be integral with system 200, or may be separate. Where a device is separate from system 200, connection between the device and system 200 may be via wired or wireless hardware and communication protocols, and may be a direct or an indirect (e.g. networked) connection.

Wired connection with other devices/networks may be by any appropriate standard or proprietary hardware and connectivity protocols. For example, system 200 may be configured for wired connection with other devices/communications networks by one or more of: USB; eSATA; Ethernet; HDMI; and/or other wired connections.

Wireless connection with other devices/networks may similarly be by any appropriate standard or proprietary hardware and communications protocols. For example, system 200 may be configured for wireless connection with other devices/communications networks using one or more of: BlueTooth; WiFi; near field communications (NFC); Global System for Mobile Communications (GSM), and/or other wireless connections.

Generally speaking, and depending on the particular system in question, devices to which system 200 connects—whether by wired or wireless means—include one or more input devices to allow data to be input into/received by system 200 and one or more output device to allow data to be output by system 200. Example devices are described below, however it will be appreciated that not all computer processing systems will include all mentioned devices, and that additional and alternative devices to those mentioned may well be used.

For example, system 200 may include or connect to one or more input devices by which information/data is input into (received by) system 200. Such input devices may include keyboard, mouse, trackpad, microphone, accelerometer, proximity sensor, GPS, and/or other input devices. System 200 may also include or connect to one or more output devices controlled by system 200 to output information. Such output devices may include devices such as a display (e.g. a LCD, LED, touch screen, or other display device), speaker, vibration module, LEDs/other lights, and/or other output devices. System 200 may also include or connect to devices which may act as both input and output devices, for example memory devices (hard drives, solid state drives, disk drives, and/or other memory devices) which system 200 can read data from and/or write data to, and touch screen displays which can both display (output) data and receive touch signals (input).

By way of example, where system 200 is a client system such as 130 it may include a display 218 (which may be a touch screen display), a camera device 220, a microphone device 222 (which may be integrated with the camera device), a pointing device 224 (e.g. a mouse, trackpad, or other pointing device), a keyboard 226, and a speaker device 228.

System 200 also includes one or more communications interfaces 216 for communication with a network, such as network 140 of environment 100 (and/or a local network within the server environment 110). Via the communications interface(s) 216, system 200 can communicate data to and receive data from networked systems and/or devices.

System 200 may be any suitable computer processing system, for example, a server computer system, a desktop computer, a laptop computer, a netbook computer, a tablet computing device, a mobile/smart phone, a personal digital assistant, or an alternative computer processing system.

System 200 stores or has access to computer applications (also referred to as software or programs)—i.e. computer readable instructions and data which, when executed by the processing unit 202, configure system 200 to receive, process, and output data. Instructions and data can be stored on non-transient machine readable medium such as 210 accessible to system 200. Instructions and data may be transmitted to/received by system 200 via a data signal in a transmission channel enabled (for example) by a wired or wireless network connection over an interface such as communications interface 216.

Typically, one application accessible to system 200 will be an operating system application. In addition, system 200 will store or have access to applications which, when executed by the processing unit 202, configure system 200 to perform various computer-implemented processing operations described herein. For example, and referring to the networked environment of FIG. 1 above, server environment 110 includes one or more systems which run a server application 114, a data storage application 116. Similarly, client system 130 runs a client application 132.

In some cases part or all of a given computer-implemented method will be performed by system 200 itself, while in other cases processing may be performed by other devices in data communication with system 200.

Figure 3:
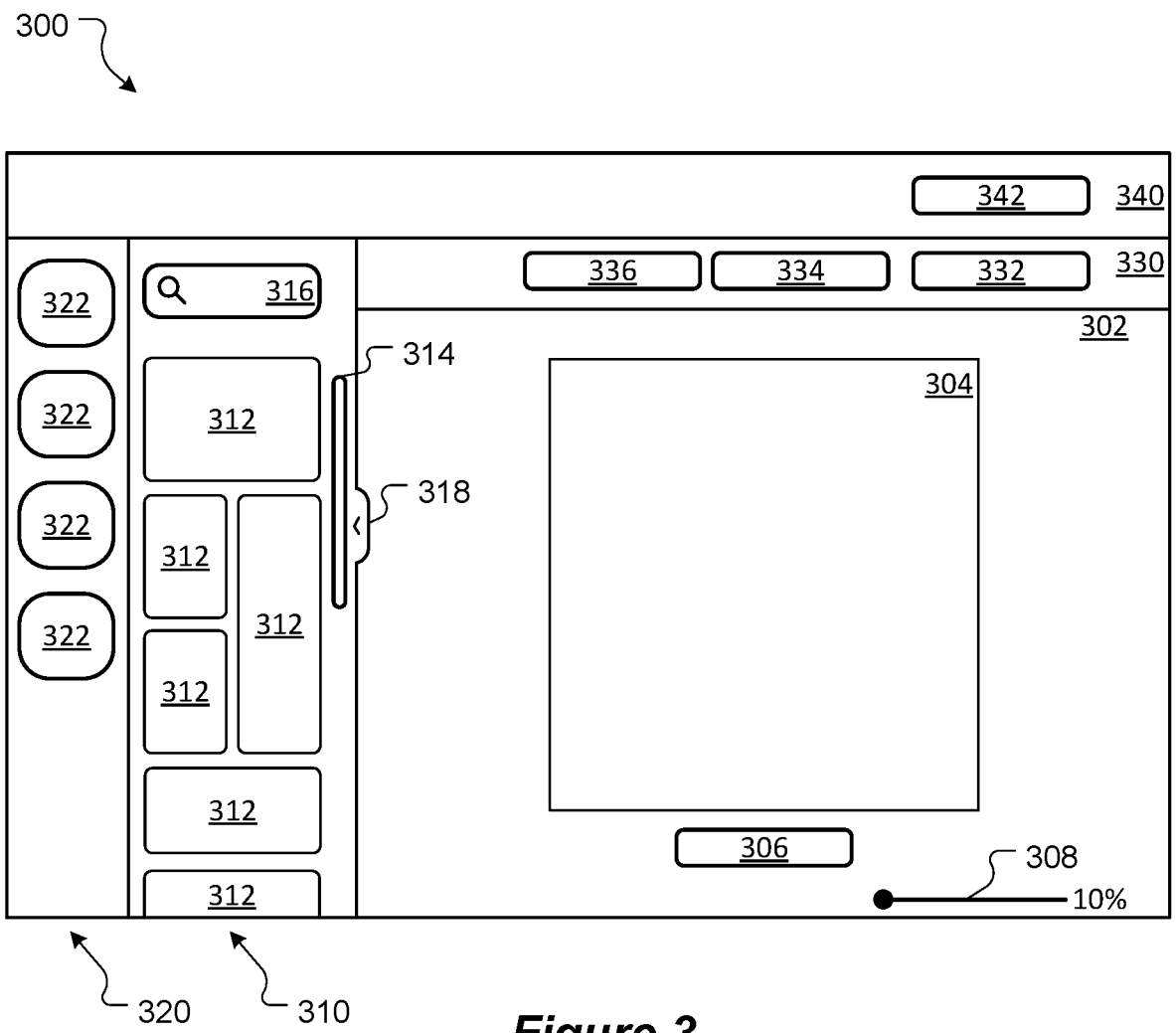
FIG. 3 depicts an example design creation graphical user interface.

In the present disclosure, the client application 132 configures the client system to provide a design creation user interface. Generally speaking, a design creation user interface (UI) will allow a user to create, edit, and output designs. To illustrate the types of features that client application 132 may provide, FIG. 3 provides one example of a design creation graphical user interface (GUI) 300. Alternative interfaces, with alternative layouts and/or providing alternative tools and functions, are possible.

GUI 300 includes a design preview area 302 in which a canvas 304 is shown. Canvas 304 is used to display a page of a design that is being worked with (e.g. created, edited, output). In this example, an add page control 306 is provided (which, if activated by a user, causes a new page to be added to the design being created) and a zoom control 308 (which a user can interact with to zoom into/out of the page currently displayed by canvas 304).

GUI 300 also includes an asset preview area 310. Asset preview area 310 displays previews 312 of assets that are made available (e.g. by server environment 110) to users to assist in creating designs. Different types of assets may be made available, for example design elements (of varying types—e.g. raster images, vector graphics, shapes, videos, audio clips, and/or other design element), design templates, design styles (e.g. defined sets of colours, font types, and/or other assets/asset parameters), and/or other assets that a user may use when creating their design. For example, a preview 312 may be of a design element (e.g. a raster graphic, a vector graphic, a video, an audio track, or an alternative element) and a user may add that design element to the design being created by dragging and dropping the preview 312 onto the canvas 304. Design elements may be added to a design in other ways. In this example, the preview area 310 displays a scroll control 314 allowing a user to scroll through previews 312. Scroll control 314 may be hidden when user focus is not in the preview area 310. Preview area 310 also includes a search control 316 via which a user can submit search data (e.g. a string of characters) to search for particular design assets. Previews 312 of the search results returned are then displayed in the preview area 310. In this example, a hide preview area control 318 is provided which can be activated to hide the asset preview area 310 (serving to enlarge the design preview area 302).

Depending on implementation, the previews 312 displayed in asset preview area 310 (and the design assets corresponding to those previews) may be accessed from various locations. In the present example, the search functionality invoked by search control 316 causes server application 114 to perform a search of assets that are available to it: e.g. assets stored in a data storage device 118 of the server environment 110. In alternative implementations, when performing a search that has been submitted via search control 316 the server application 114 (and/or client application 132) may search additional and/or alternative locations, for example: locally accessible data storage (e.g. non-transient memory such as 210 that is part of/connected to client system 130); third party server systems that serve relevant content and are accessed via communications network 140 (e.g. via a general web search or other mechanism); and/or other locations.

GUI 300 also includes a type selection area 320 which displays a plurality of type selection controls 322. The type selection controls 322 may be activated by a user to select a type of design asset for which previews 312 are displayed (and can be searched for) in asset preview area 310. By way of example, type selection controls 322 may be provided for types such as design templates, photos (e.g. raster graphics), graphics (e.g. vector graphics), text, audio, video, styles, and/or other types.

GUI 300 also includes an adaptive control area 330 for displaying adaptive controls 332. Adaptive controls 332 change depending on the type of design element that is currently selected/being interacted with by a user. For example, if a text element is selected adaptive controls 332 such as font style, type, size, position/justification, and/or other font related controls may be displayed. Alternatively, if a vector graphic element is selected, adaptive controls 332 such as fill, line style, transparency, and/or other vector graphic related controls may be displayed.

GUI 300 also includes an additional control area 340 which displays additional controls 342. Any appropriate additional controls 342 may be displayed, for example controls to save, download, print, share, resize, and/or perform other actions.

Once created, a user may output a design in various ways. For example, client application 132 may provide a user with options to output a design by one or more of: saving the design to local memory of client system 130 (e.g. non-transient memory 210); saving the design to data store 118 of server environment 110; printing the design to a printer (local or networked); communicating the design to another user (e.g. by email, instant message, or other electronic communication channel); publishing the design to a social media platform or other service (e.g. by sending the design to a third party server system with appropriate API commands to publish the design); and/or by other output means.

Data in respect of designs that have been (or are being) created may be stored in various formats. An example design data format that is used throughout this disclosure will now be described. Alternative design data formats (storing alternative design attributes) are, however, possible, and the processing described herein can be adapted for alternative formats.

In the present context, data in respect of a given design is stored in a design record. Generally speaking, a design record defines certain design-level attributes and includes page data. The page data includes (or references) one or more page records, each of which defines a page of the design. In turn, each page record may define one or more page—level attributes as well as element data for the page. The element data for a given page defines (or references) one or more element records which define design elements that have been added to the page In the present example, the format of each design record is a device independent format comprising a set of key-value pairs (e.g. a map or dictionary). To assist with understanding, an example partial of a design record format is as follows:

| Key/field | Note | E.g. |
|---|---|---|
| Design ID | A unique identifier of the Design. | "designId": "abc123", |
| Version | An identifier of a specific version of the design. | "version": "00001", |

-continued

| Key/field | Note | E.g. |
|---|---|---|
| Creation date | The creation date of the document. | "creationDate": "1-jun-2020", |
| Creator ID | The identifier of a creator/owner of the design. (The ID will typically allow other user details to be retrieved, e.g. from a user database). | "userID": "UID00000001", |
| Dimensions | Dimensions (e.g. width and height) of the pages of the design. | "dimensions": {<br>   "width": 1080,<br>   "height": 1080<br>}, |
| Pages | An array of page records (described further below). | "pages": [<br>  {"elements": [{...}, {...},..., {...}]},<br>  {"elements": [{...}, {...},..., {...}]},<br>  ...,<br>  {"elements": [{...}, {...},..., {...}]}<br>], |

In this example, the design-level attributes include a design identifier, version, creation date, creator ID, and default page dimensions.

A design may be associated with a colour palette. A colour palette in this sense is a defined set of colours—for example an array (or other set) of colour values such as RGB values or alternative colour space values. Where a design is associated with a colour palette, the colour palette (or an identifier thereof) may be stored as a design-level attribute.

A design record's page data is a set (in this example an array) of page records, each of which defines page data in respect of a page of the design. A page record's position in a design's page array serves to identify the page and also determines its position in the design (e.g. a page at array index n appears after a page at array index n−1 and before a page at array index n+1).

In this example, each page record includes element data in the form of an element set (in this example an array). While not shown, a page record may also include additional page-level data, for example page dimensions (which, if present, override the design-level dimensions).

Each element in a page's element array is either an element record (defining a single element that has been added to the page in question) or a set of element records (e.g. a further element array which defines a group of elements—i.e. two or more elements that have been added to the page and grouped together).

In this example, an element record's position in an element array serves to identify that element and determines its depth on the page (e.g. an element at array index n is positioned above an element at array index n−1 and below an element at array index n+1). Element depth may be alternatively handled, however, for example by storing depth as an explicit element attribute.

Generally speaking, an element is an object that has been added to a page—e.g. by copying (such as a drag and drop interaction in a design creation user interface such as GUI 300 above), importing from one or more element libraries (e.g. libraries of images, animations, videos, etc.), drawing/creating using one or more design tools (e.g. a text tool, a line tool, a rectangle tool, an ellipse tool, a curve tool, a freehand tool, and/or other design tools), or otherwise being added to a design page. As described in detail below, the present disclosure provides a quick-add mechanism for adding elements to a design.

The types of design elements available will depend on the system in question. By way of example, however, design element types such as the following may be provided: image elements (e.g. raster and/or vector graphic elements); video elements; audio elements; text elements; frame elements (e.g. vector graphic elements configured to receive other elements—such as graphics or videos); effects (e.g. an effect that applies to a page, such as a shower of confetti or other effect); and/or elements of other types.

The particular data (or attributes) associated with a design element that has been added to a page will depend on the type of element. For example, a video type element may include attributes such as start/end trim times and audio which may not be relevant to other element types. By way of example, however, an element record for an image type element may be as follows:

| Key/field | Note | E.g. |
|---|---|---|
| Type | A value defining the type of the element (E.g. image, text, video, audio, other) | "type": "IMAGE", |
| Position | Data defining the position of the element on the page - e.g. a top-left (x, y) coordinate pair. | "position": (100, 100), |
| Size | Data defining the size of the element - e.g. a (height, width) pair. | "size": (500, 400), |
| Rotation | Data defining any rotation of the element. | "rotation": 0, |
| Opacity | Data defining any opacity of the element | "opacity": 1, |
| Media identifier | Data defining a link or pointer to a location where the original element data - e.g. the original raster or vector image data in this example - is located. | "mRef": "abc123", |

The storage location for design data (e.g. design records) will depend on implementation. For example, in the networked environment described above design records are (ultimately) stored in/retrieved from the server environment's data storage 118. This involves the client application 132 communicating design data to the server environment 110—for example to the server application 114 which stores the data in data storage 118. Alternatively, or in addition, design data may be locally stored on a client system 130 (e.g. in non-transient memory 210 thereof).

The present disclosure concerns adding elements to designs. As noted above, in some implementations a design may be able to have multiple pages. Where multi-page designs are possible, reference in the present disclosure to adding an element to a design is (unless stated otherwise) to be understood as adding an element to a particular page of a design. The particular page will, for example, typically be a page selected by a user—for example a page that has been selected and is displayed in a preview area such as area 302 of UI 300 described above.

As noted, the present disclosure provides a quick-add mechanism by which a user can quickly add a design element to a design (or, more specifically, a design page). Operation of the quick-add mechanism is described in detail below, however generally involves a user submitting a query (referred to as a quick-add query) which is processed with reference to a set of reserved strings (e.g. reserved keywords or keyword combinations). In the present embodiments, the set of reserved strings includes special command strings, defined element strings, and search category strings.

Generally speaking, each special command string defines a special command and is associated with a special command action. When a special command is submitted, application 132 performs the action associated with that command. Any appropriate special commands (and associated actions) may be defined, examples of which are described below.

Generally speaking, each defined element string defines an add defined element command and is associated with a specific design element. When an add defined element command is submitted, application 132 causes the element associated with that command to be added to the design. Any appropriate defined element strings may be provided, several examples of which are provided below. Typically, however, defined element strings will be provided for commonly used design elements.

Generally speaking, each search category string defines a search category and is associated with a particular design element category in which a user may wish to search for a design element. Submitting a quick-add command that includes a search category string causes the associated design element category to be set as the search category for a submitted quick-add query.

The set of reserved strings is maintained in a reserved string dataset. Any appropriate format/structure may be used for the reserved string dataset. In the present embodiments, the reserved string dataset is a map of key/value pairs. Each key/value pair defines a reserved string record. The key of a reserved string record is the reserved string itself. The value of the key value record provides data in respect of the reserved string's: associated action (for a special command string); element (for a defined element string); search category (for a search category string).

To illustrate, an example reserved string dataset with example reserved string records (key/value pairs) is as follows:

```
{
    //example special command strings
    "help": {<display help information>},
    "rule": {<display rule information>},
    "grids": {<display available grids>},
    //example defined element strings
    "text": {<text element data>},
    "line": {<line element data>},
    "arrow": {<arrow element data>},
    "circle": {<circle element data>},
    "square": {<square element data>"},
    "rectangle": {<rectangle element data>},
    "heart": {<heart element data>},
    "pie chart": {<pie chart element data>},
    "bar chart": {<bar chart element data>},
    "line chart": {<line chart element data>},
    "star": {<star element data>},
    "triangle": {<triangle element data>},
    "hexagon": {<hexagon element data>},
    "pentagon": {<pentagon element data>},
    //example search category strings
    "graphics": {<graphic search category>},
    "photos": {<photo search category>},
    "videos": {<video set search category>},
    "logos": {<logo search category>},
    "emojis": {<emoji search category>},
}
```

In this example, the special command strings are "help", "rule", and "grids".

When submitted, the help and rule strings may a help interface to be displayed which includes information regarding the quick-add mechanism. In this case, the action data associated with the help and rule strings may cause a client application 132 to display the help interface with help information. The help information may be part of the action data, or the action may include a URL (or other link/pointer) to such information.

In this example, the action associated with the "grids" special command string causes the client application 132 to display available grids—for example in an asset preview area 310 as described above. In the present context, grids are design page layouts which are defined by a particular arrangement of design element placeholders.

Additional and/or alternative special command strings and associated actions may be defined.

In this example, each defined element string is associated with data that identifies a specific design element. E.g. the data associated with the "text" reserved string will identify a particular text element with certain default attributes (e.g. default font style, default font size, default font colour, default text—e.g. "your text"—and/or defaults for any other relevant attributes). As another example, the data associated with the "circle" reserved string record will identifies a particular circle element with certain default attributes—e.g. a vector graphic circle element with a default line colour, a default fill colour, a default radius, and/or defaults for any other relevant attributes.

In some cases, the data associated with a defined element string may be data that client application 132 can use to generate the defined element itself. For example, the data associated with the "line" string may be vector graphic data that defines a line (or particular attributes of a line). In other cases, the data associated with a defined element string may be an element identifier which the client application 132 can use to retrieve an element from the server application 114. For example, the data associated with the "star" string may be an element identifier that identifies a particular star graphic.

In this example, each search category string is associated with a particular search category. E.g. the "graphics" reserved string record identifies the "graphics" element category. When a search is conducted, the server application 114 may use the search category: for example, if the graphics search category has been submitted server 114 may limit searching to design elements flagged as graphic-type elements.

In the present implementation, the reserved string dataset is maintained at the server environment 110 (e.g. in data storage 118). When a client application 132 accesses the design platform, server application 114 communicates the current version of the reserved string dataset to the client application 132 where it is maintained as a locally accessible version of the reserved string dataset (e.g. in volatile memory such as 208).

Figure 4:
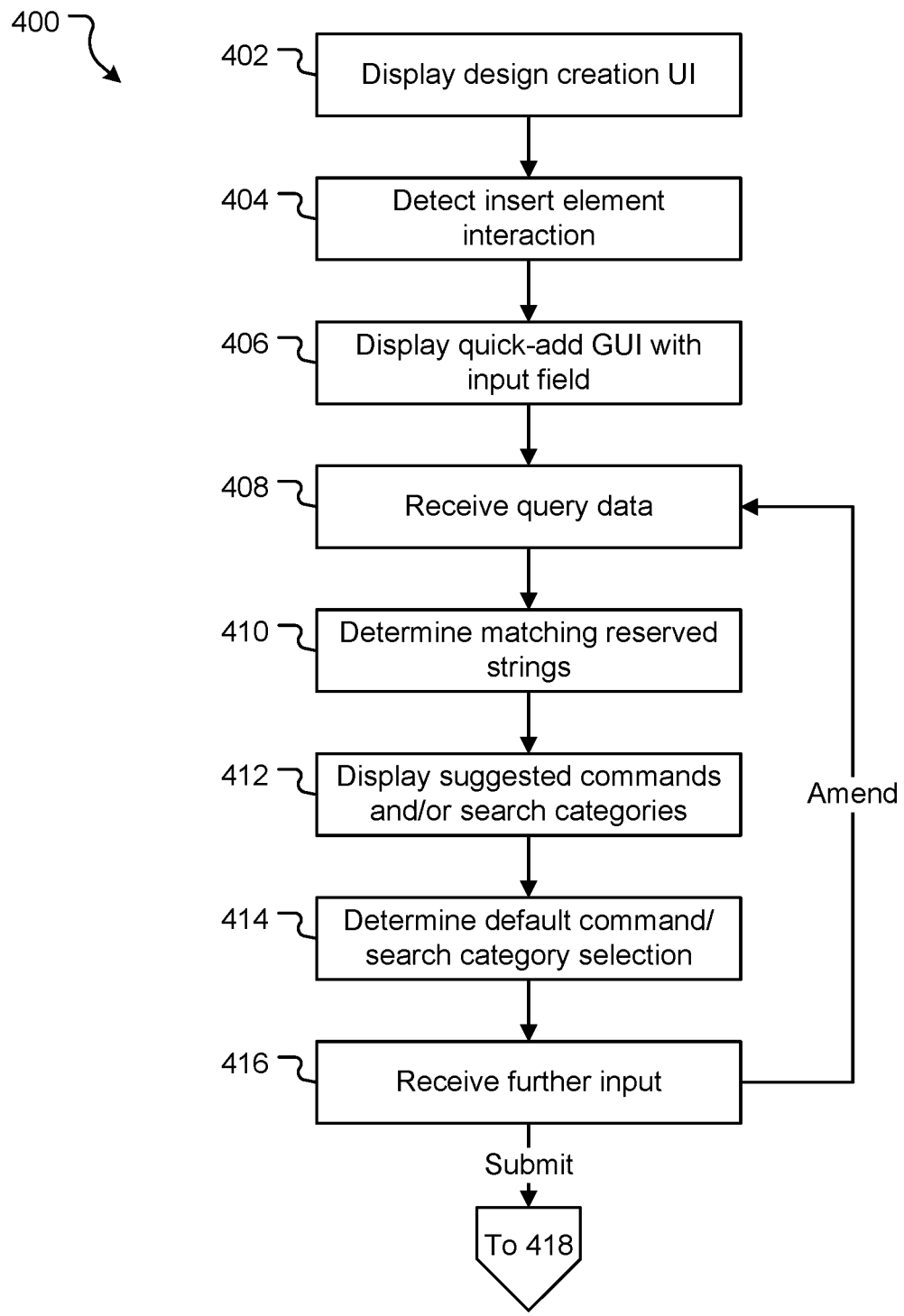
FIG. 4 depicts operations performed in an element addition process.
Figure 4:
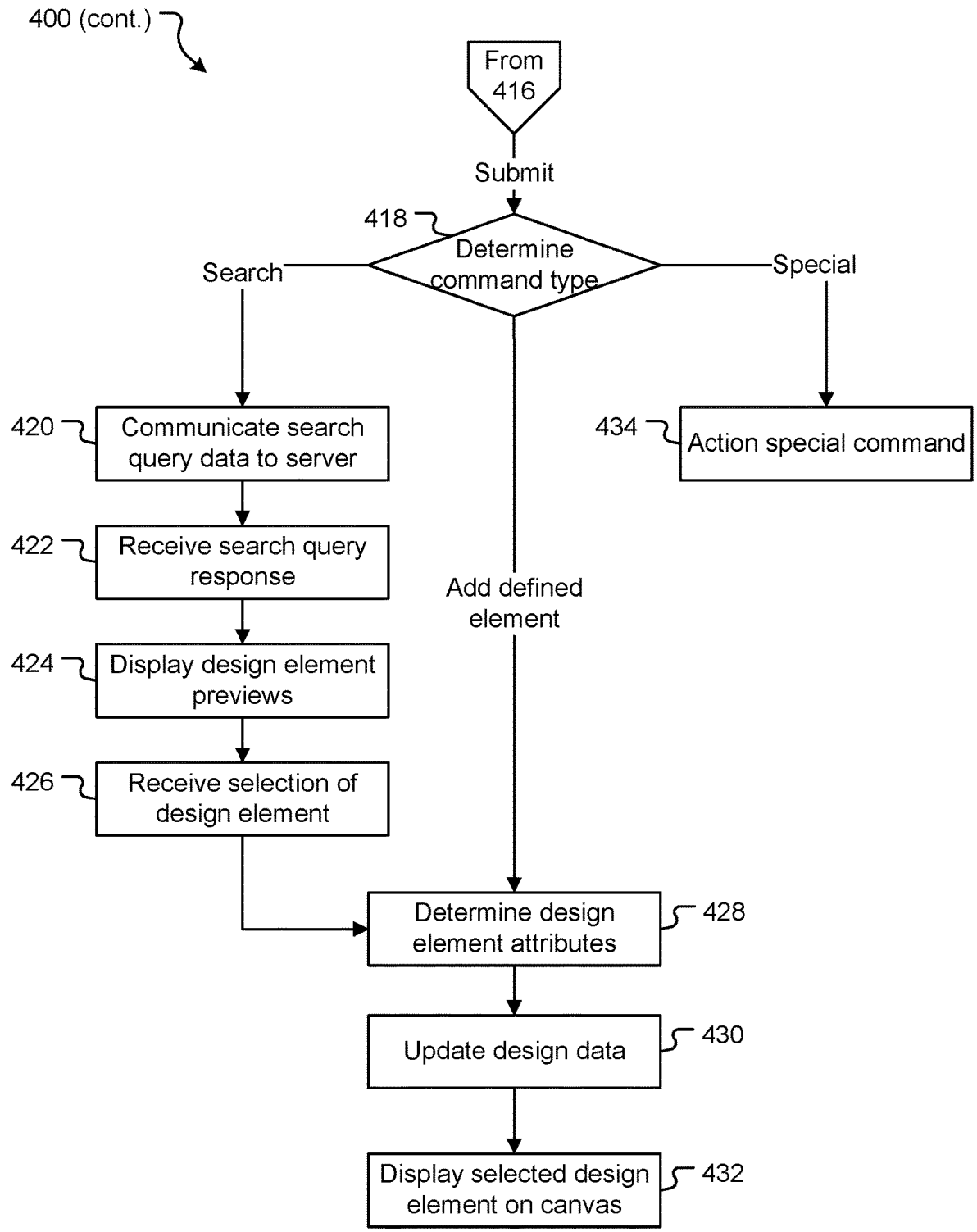

Turning to FIG. 4, operations involved in an element addition process 400 (also referred to as a quick-add process) will be described. Element addition process 400 will be described with reference to FIGS. 5 to 8, each of which depict a version of the preview area 302 of UI 300 described above.

At 402, client application 132 displays a design creation GUI. This may, for example, be a design creation GUI such as 300 described above, and include a design preview area 302 in which a design being created/edited (or a particular page thereof) is displayed on a canvas 304.

In the present embodiments, in order to display the design creation GUI client application 132 retrieves data from server application 114. This may involve client application 132 logging into the server application 114 (via a user account). The server application 114 may then communicate various data to the client application which can be displayed (or accessed via) the design creation GUI. In the present embodiments, the data communicated to the client application 132 includes a copy of the reserved string dataset which becomes the client application's locally accessible reserved string dataset.

At 404, client application 132 detects an insert element user interaction. In one implementation, the insert element user interaction is a keyboard shortcut—e.g. user activation of a key (such as '/' or an alternative key) or a combination of keys (such as 'control'+'/' or an alternative key combination). The keyboard shortcut may be input by a physical keyboard 226 of client device 130 or a software keyboard displayed on a display 218 of client device 130. Alternatively, or additionally, the insert element user interaction may be user interaction via a pointing device 224 (e.g. a right click or other action while a pointing device cursor is in the preview area 302 or another defined area of the design creation UI); a defined touchscreen gesture (e.g. a dwell, tap, swipe, flick or other gesture in the preview area 302 or another defined area of the design creation UI); or a predefined voice command received via microphone 222 (e.g. detecting the word "add" or "insert"—or any other defined word—has been spoken).

At 406, in response to detecting the predefined insert element user interaction, the client application 132 displays a quick-add graphical user interface. The quick-add GUI in includes a quick-add input field (which is a text input field).

In the present embodiments, client application 132 is configured to display the quick-add GUI in a design preview area (e.g. area 302 of GUI 300 described above). More particularly, client application 132 is configured to display the quick-add GUI atop a preview of the design that is currently being created (e.g. atop canvas 304). By displaying the quick-add GUI in the design preview area or atop the canvas 304 the user's attention is not diverted away from the design they are currently creating. In many cases this will be advantageous as it will reduce the cognitive burden placed on the user. For example, it allows the user to make use of the quick add mechanism to add elements to their design without having to turn their attention from the design canvas to other areas of the design creation user interface such as search panels, controls, menu structures, or other UI elements.

Figure 5:
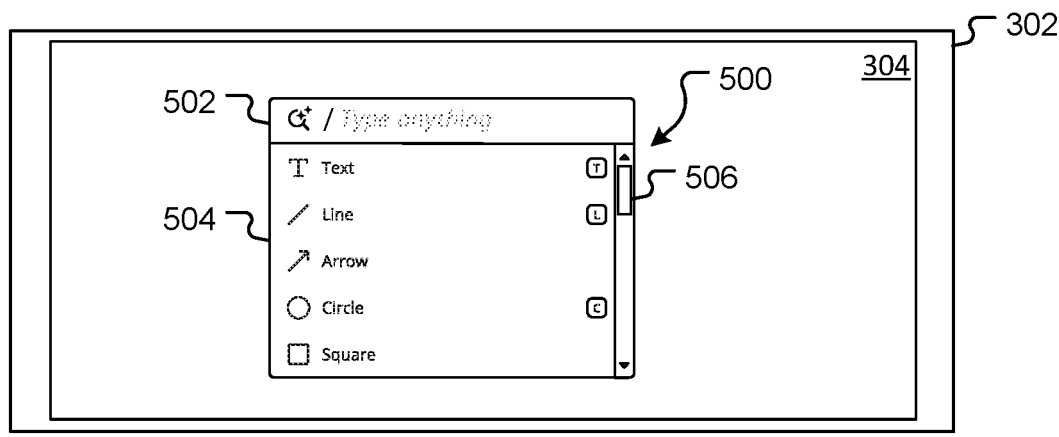
FIGS. 5 to 8 are examples of partial user interfaces.

FIG. 5 provides one example of a quick-add GUI 500 that has been displayed in response to detecting the predefined insert element user interaction. In this example, quick-add GUI 500 includes a quick-add text input field 502, which is displayed directly on the canvas 304.

In this example, quick-add GUI 500 also includes a suggestion region 504. In FIG. 5, no user query data has been entered into quick-add input field 502. In this particular example, where no query data has been entered application 132 displays commands corresponding to reserved keywords in the suggestion region 504 (in this case commands corresponding to all reserved keywords can viewed via scroll bar 506). In alternative embodiments, where no query data has been entered application 132 may: display only the quick-add input field 502 (without a suggestion region 504 or with an initially empty suggestion region 504); display a subset of commands corresponding to reserved keywords; display commands corresponding to some or all reserved keywords in a particular default order. In the latter example, the default order may be based on various data, for example: the commands most commonly selected by all users of the design platform (or a group of users of the design platform); the commands most commonly selected by the user in question; the commands most commonly selected (by all users, a group of users, or the user in question) for the type of design that is being create (e.g. whether the design is a poster, a presentation/slide show, a social media post, or an alternative type of design).

In certain implementations, client application 132 is configured to determine an interaction position associated with the insert element user interaction. In this case, application 132 may display the quick-add GUI 500 at a position based on the interaction position. For example, the quick-add GUI 500 may be centered on the interaction position (provided there is room in the user interface to do so). The position of quick-add GUI 500 may, however, be based on the interaction position in alternative ways, for example by locating the top-left corner (or an alternative point) of the quick-add GUI 500 on the interaction position.

Where the insert element user interaction is a keyboard shortcut or pointing device interaction, the interaction position may be a location of a pointing device cursor at the time the keyboard shortcut is detected. Where the predefined insert element user interaction is a touch screen interaction, the interaction position may be a location at which the contact was made. If the location of the pointing device cursor at the time of the keyboard shortcut/pointing device interaction, or the location of the touch input, is not on or near the canvas 304, a default interaction position (e.g. a centre of the canvas 304 or other default location) may be used. Similarly, where the insert element user interaction is a voice command, a default interaction position (e.g. a centre of the canvas 304) may be used.

In alternative implementations, client application may forego determining an interaction position and/or display the quick-add GUI 500 at a default position regardless of any position associated with the interaction—e.g. at the centre of the canvas 304 or an alternative default location.

At 408, client application 132 receives query data via the quick-add input field displayed at 406. The query data defines a string of one or more characters. The client application 132 may receive query data by a user typing the one or more characters on a physical or software keyboard. Alternatively, the client application 132 may receive query data by processing audio input to detect and recognise spoken characters and/or words.

At 410, client application 132 determines if the query data matches any reserved strings in the reserved string dataset. To do so, client application 132 searches the keywords defined in the reserved string dataset using the character(s) in the relevant search string to determine if those characters appear in any of the reserved strings.

By way of example, and in the context of the reserved string dataset described above, initial query data of "cha" would be found to match the defined element strings "pie chart", "bar chart", and "line chart". Conversely, initial query data of "x" would be found to match the defined element strings of "text" and "hexagon". As a further example, initial query data of "help" would be found to match the special command string of "help". As yet a further example, initial query data of "ph" would be found to match the defined element string of "pie chart" and the search category strings of "graphics" and "photos".

At 412, client application 132 displays suggested commands corresponding to any matching reserved strings that are identified at 410 in the quick-add GUI. If no matching reserved strings are identified, no suggested commands are displayed. If one or more matching reserved strings are identified each suggested command is displayed (or, at least, provided for display, for example via a scrollbar or the like).

At 412, client application 132 also displays suggested search categories in the quick-add GUI. In certain implementations, client application 132 may be configured to display all search category strings in the reserved string dataset as suggested search categories. In other implementations, only a subset of search category strings may be displayed as suggested search categories. In this case, the search categories displayed may depend on various factors including, for example, what functionality the user account in question has access to. For example, the "logo" search category may only be displayed where the user account is associated with a brand or user group for which logos have been defined.

At 414, client application 132 determines a particular command or search category which is selected by default. This will be referred to as the default selection. Client application 132 may determine the default selection in various ways.

In the present embodiments, if a single matching reserved string is determined at 410, client application 132 determines the suggested command corresponding to that reserved string to be the default selection. If multiple matching reserved strings are identified at 410, client application 132 determines a suggested command corresponding to one of those reserved strings to be the default selection. This determination may be made in various ways including, for example, by reference to a defined priority order of reserved strings (in which case the matching reserved string that has the highest priority in the priority order is determined to be the default selection), by randomly selecting one reserved string from the matching reserved strings, with reference to usage data (e.g. which of the matching reserved strings is most commonly submitted by the user or a group of users), or in an alternative way.

If no matching reserved strings are identified, client application 132 may determine a suggested search category to be the default selection. If multiple search categories are suggested, client application 132 may determine a particular suggested search category to be the default selection in various ways including, for example: selection based on a defined priority order of search categories; selection based on usage data (e.g. the search category most commonly selected by the user or a group of users); random selection from the suggested search categories; or an alternative selection mechanism.

In the present embodiments, once client application 132 has determined the default selection it causes this selection to be visually indicated in the quick-add GUI.

Figure 6:
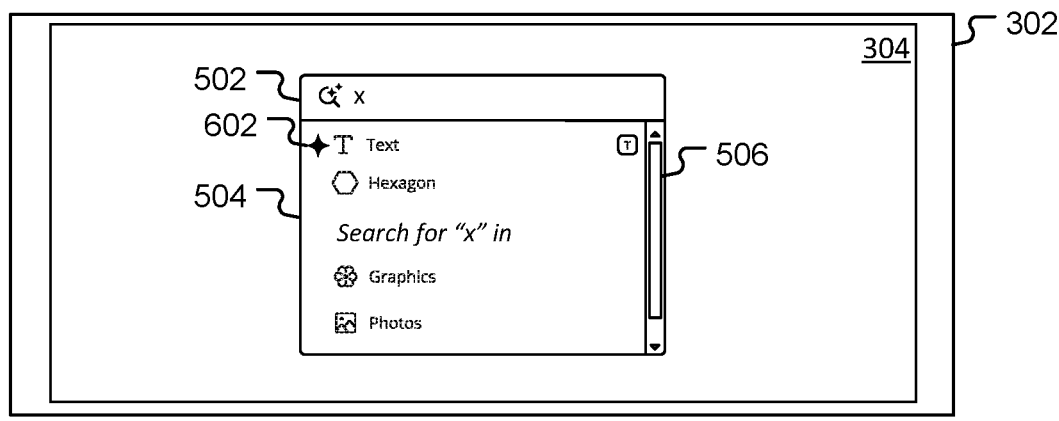

An example of operations 412 and 414 are depicted with reference to the updated quick-add GUI 500 of FIG. 6. In this example, a user has entered the character 'x' into the input field 502. At 410, client application 132 determines that the input query matches the reserved strings of "text" and "hexagon", which are displayed (at 412) as suggested commands in the suggestion region 504.

In this example, client application 132 has also identified "graphics", "photos", and "videos" as suggested search categories, these also displayed in the suggestion region 504 of quick-add GUI 500 (though in this example the "video" search category does not initially fit within suggestion region 504, leading to display of scroll bar 506 which can be used to scroll through and display the suggestions).

As can be seen, in this example the suggestion region 504 is displayed so suggested commands (e.g. "text" and "hexagon") are visually separated from suggested search categories (e.g. "graphics" and "photos"). In this particular example this separation is via a text-cue which indicates to a user that that they can "search for <input string>" in a particular search category.

Further, in this example client application 132 has determined (at 414) the default selection to be the "Text" command, which in this example, is visually indicated by a star icon 602.

At 416, client application 132 receives further user input. In the present context, the further input may be a query amendment input, a change selection input, or a submit input.

In the present example, a query amendment input is input that amends the current query. This may be input which adds/deletes/amends the text that has been entered into the quick-add input field. Where query amendment input is received, processing returns to 408 to determine whether the amended query results in any different suggested commands or search categories.

A change selection input that changes the currently selected suggested command or suggested search category to a new suggested command or suggested search category. The current selection may either be the default selection (determined at 414) or another selection the user has already made. Client application 132 may be configured to provide for/detect various change selection user inputs. For example, a user may use defined keys (e.g. up and down arrows and/or other defined keys) to change the currently selected command or search category. As another example, where a touch screen is being used a user may select a new command or search category by touch input (e.g. contacting or dwelling on a particular command or category). As a further example, a user may select a new command or category by a cursor device—e.g. positioning a cursor over a particular command or category and clicking a button. Where client application 132 detects a change selection user input, it causes the newly selected suggested command or suggested search category to be flagged as the current selection and for that selection to be visually indicated. For example, if in quick-add GUI 500 of FIG. 6 a user selected the "Graphics" search category (e.g. by two down-arrow keyboard interactions, selection by a mouse cursor, or an alternative interaction) client application 132 would flag "graphics" as the currently selected search category and move indicator 602 from the previous selection ("text") to the new selection ("graphics").

In the present example, a submit input is input that submits the current query. Application 132 is configured to allow for various submit inputs.

In the present example, user activation of a defined submit control is a submit input. This may, for example, be the 'enter' key of a physical or software keyboard, or an alternative defined control.

User selection of a suggested command or suggested search category that is displayed in the suggestion region 504 is also a submit input. This may, for example, be by operation of a cursor control, touch input, and/or other input that selects a particular suggested command or search category (e.g. keyboard input—such as arrow keys—navigating between suggestions to select one then activation of the submit input (e.g. enter or an alternative key/control).

In response to detecting a submit input, processing proceeds to 418.

At 418, application 132 determines a type of the command that has been submitted. The type of command that is submitted is determined with reference to the suggested command or suggested search category that is currently selected.

If a suggested search category is currently selected, application 132 determines that the submitted command is a search command and processing proceeds to 420. For example, and referring again to FIG. 6, if a user selected the "Graphics" search category and then submitted the query, this would be a search command (in this particular example, a command to search "graphic" type design elements based on the query 'x').

If a suggested command that corresponds to a defined element string is currently selected, application 132 determines that the submitted command is an add defined element command and processing proceeds to 428. For example, if a user submitted the query as shown in FIG. 6, in which the suggested command "text" is selected, this would be an add defined element command (in this particular example, a command to add the "text" element defined by the reserved "text" string record).

If a suggested command that corresponds to a special command is currently selected, application 132 determines that the submitted command is a special command and processing proceeds to 434. For example, if a user submitted a query with a suggested "help" command selected, this would be a special command.

At 420, a search command has been submitted. In this case, client application 132 generates search query data and communicates this to server application 114. The search query data includes data indicating the currently selected search category as well as the query data (e.g. the character or characters that have been entered into the quick-add input field).

Figure 9:
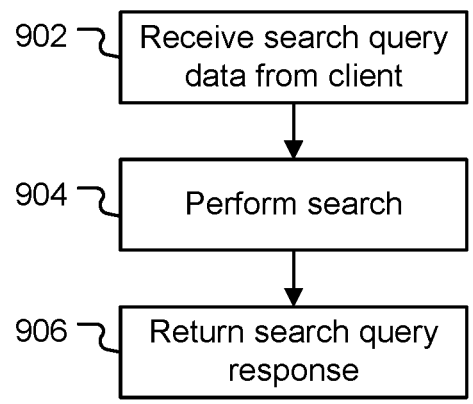
FIG. 9 depicts operations performed by a server application on receiving search query data from a client application.

As discussed below with reference to FIG. 9, server application 114 processes the search query data and returns a search query response. In the present embodiments, the search query response includes a set of search results, each search result identifying a particular design element and providing preview data for that element.

At 422, client application 132 receives the search query response from the server application 114.

At 424, client application 132 displays previews of the search results defined in the search query response. An example of this is shown in updated FIG. 7, which depicts an updated version of quick-add GUI 500.

Figure 7:
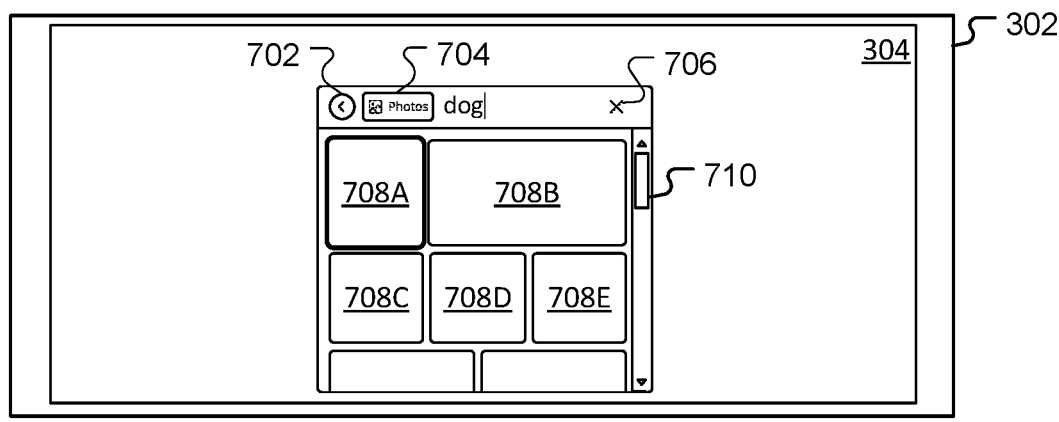

In FIG. 7, quick-add GUI 500 has been updated to include a clear all control 702, activation of which clears the selected search category and text that has been input. Quick-add GUI 500 has also been update to display a search category identifier 704 which indicates the selected search category (in this example the "photos" category). Quick-add GUI 500 also includes a clear text input control 706, activation of which causes client application 132 to clear the text that the user has entered into the quick-add input field 502 (without also clearing the selected search category). Quick-add GUI 500 of FIG. 7 also displays previews 708 (e.g. thumbnails) of several search results. Scroll bar control 710 allows a user to scroll through previews of additional search results. In this example, the selected search category is "photos" (indicated by search category identifier 704) and the query data is "dog". Accordingly, the search results (and previews 708 thereof) will depict photos of (or that are in some way related to) dogs.

At 426, client application 132 receives user input selecting of a particular preview 708 (and, therefore, the design element that preview 708 relates to). This may be by a user clicking on, contacting, or otherwise selecting a particular search result preview 708 (which causes selection of the element the preview corresponds to). Processing then proceeds to 428.

While not shown, at 426 client application 132 may alternatively detect activation of the clear all control 702 or the clear text input control 706. If the clear all control 702 is activated, client application 132 clears the selected search category and the query input. Processing may then return to 406. If the clear text input control 706 is activated, client application 132 clears the text input without clearing the selected search category. In this case, client application 132 may await further text input and, on receiving such input, return to processing similar to 418 (e.g. by communicating further search query data to the server, the further search query data including the previously selected search category and the newly entered text input).

At 428, a design element has been selected. The design element may have been selected by submission of an add defined element command at 416 (in which case the selected design element is the design element associated with the defined element string that has been submitted) or by user input selecting a preview (and corresponding element) at 426. In this case, application 132 determines attributes for the selected design element.

Determining attributes is described in further detail below. Depending on implementation, attribute determination may be performed by client 132 or by server application 114 (which then communicates the relevant attributes to the client application 132). Generally speaking, for most types of elements the attributes determined include at least size and position attributes.

At 430, client application 132 updates the design data for the design being created to add data in respect of the selected design element. In the present embodiments, this involves submitting data to the server application 114 (e.g. an identifier of the selected element and/or other design element data) which then updates the design data for the design. In the context of the example design data described above, adding an element to the design involves generating an element record for the element and adding it to the element array of the relevant page (e.g. the page currently displayed on canvas 304). In this example, the new element is added as the top-most element on the page and, therefore, the element record is appended to the end of the page's element array. The element record includes the element attributes determined at 428 and other relevant data, for example, the element identifier (or an element reference/link obtained using that identifier).

Figure 8:
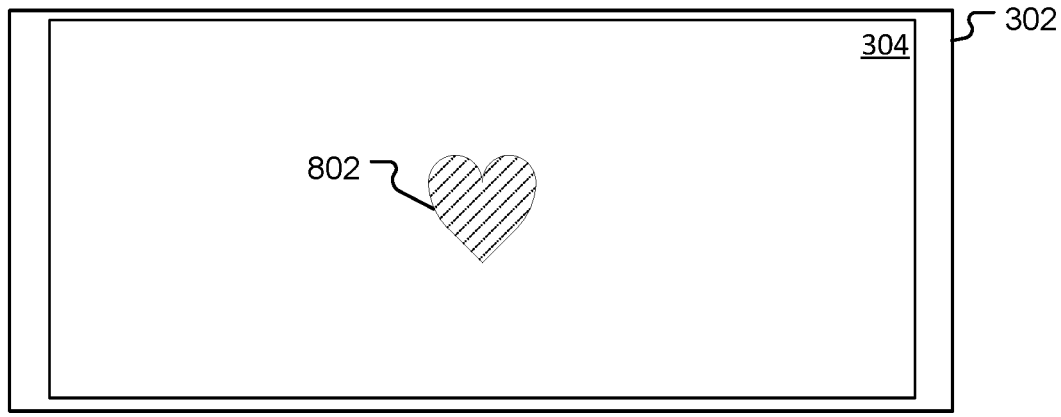

At 432, client application 132 displays the selected design element on the canvas 304. The design element is displayed in accordance with the attributes determined at 428. By way of example, FIG. 8 depicts canvas 304 after a user has selected a "heart" element. In this example, the selected heart element 802 is displayed in a central position on the canvas.

In some instances, client application 132 may need to retrieve element data from the server application 114 in order to display the element. In other instances, client application 132 may already have (or be able to locally generate) element data required to display the element.

To illustrate the above, two alternative sequences of events leading to a particular element (e.g. a heart element such as 802) will be described.

One such sequence of events is: query data of "hear" is received at 408; the reserved string of "heart" is identified as a matching reserved string at 410 and displayed as a suggested command at 412; the "heart" suggested command is determined to be the default suggestion at 414; input submitting the query is received at 416; attributes for the heart element defined by the "heart" defined element string are determined at 428; the heart element is displayed at 432.

As will be appreciated, this provides a very quick method of adding an element to a design, and one that does not require the user's attention to be diverted from the design canvas. For example, and with one specific implementation in mind, if a user wishes to add a circle (or any other element that has been defined by a defined element string) the user need only enter the keystrokes "/" "c" and "enter" (in this example "/" being a defined insert element interaction detected at 404, "enter" being a defined submit input detected at 416, and the defined element string "circle" being the default command selected at 414).

An alternative sequence of events is: query data of "hear" is received at 408; the reserved string of "heart" is identified as a matching reserved string at 410 and displayed as a suggested command at 412; the "graphic" search category is also displayed at 412; user input selecting the "graphic" search category is received at 416, followed by user input submitting the query; search query data is communicated to the server at 420; a search query response is received at 422; search result previews (e.g. of "heart" graphics) are displayed at 424; user input selecting a particular preview is received at 426; attributes for the heart design element corresponding to the selected preview are determined at 428; the heart element is displayed at 432.

This sequence of events also provides a quick method of adding an element to a design that does not require the user's attention to be diverted from the design canvas. In this sequence, however, a user is not limited to a predefined element but instead is quickly provided with search results so the user can (if desired) select and add a particular element to the design.

Following display of the selected design element(s) at 432 the quick-add process is complete (though may be reinitiated via an insert element interaction at any point).

At 434, the submitted command is determined to be a special command. In this case, client application 132 performs the action defined by the special command (in the reserved string dataset). For example, if the submitted command is "help", client application 132 may be configured to display a help user interface (not shown). This may involve client application 132 retrieving help information from server application 114 to display in the help user interface.

Once the special command has been actioned, further processing will depend on the special command in question. For example, the quick-add process may end, a user may select an alternative suggested command (or select a search category), or a user may enter alternative text into the quick-add input field.

At 420 of the element addition process 400 described above, the client application 132 communicates search query data to the server application 114. Example processing 900 performed by the server application 114 on receiving search query data will be described with reference to FIG. 9.

At 902, server application 114 receives search query data from a client application 132. In the present example, the search query data includes data indicating a selected search category (for example "photo", "graphic", "video", or other data indicating search category) as well as query data (e.g. the character or characters that have been entered into the quick-add input field).

At 904, server application 114 uses the search query data to perform a search for design elements. For example, server application 114 may search available design assets (e.g. via data storage application 116) for design elements that are of a type that matches the selected search category and which satisfy the query data.

Server application 114 may perform the search in various ways. Further, server application 114 may take additional data into account when performing the search to either define search parameters or determine a search result order. Such additional data may include, for example, element usage data that indicates how frequently elements are selected for inclusion in designs being created by users. Usage data may include general usage data (e.g. usage across all users of the design platform), group usage data (e.g. usage across one or more subgroups of platform users), or individual usage data (e.g. usage data for the user who is currently using the quick-add mechanism).

Additional data used to perform the search at 904 may also, or alternatively, include element rating data (e.g. user submitted ratings in respect of design elements).

As a further example, additional data may include data based on the type of design the user in question is preparing (which may, in turn, be determined by a template the user has selected—e.g. a poster design, a slide show design, a website design, a social media post design for a particular social media platform).

At 906, server application 114 generates a search query response and communicates this to the client application 132. In the present embodiments, server application 114 is configured to select a subset of the search results for inclusion in the search query response (e.g. the top n search results). For each selected search result, the submitted query response includes data allowing the element of the search result to be identified (e.g. an element identifier) as well as a preview of that element (e.g. a thumbnail representation of the element). In some implementations, the search query response may include the actual element data.

In some implementations, server application 114 may receive a request from the client application 132 to provide further search results (for the same search query data). This may, for example, be due to a user scrolling or otherwise navigating through the search results that have already been provided. In this case, server application 114 may identify a further set of search results (e.g. the next n search results)

and communicate data in respect of those search results in a further search query response.

At 428 of process 400 attributes for a selected design element are determined. This may be performed in various ways.

In some instances, determining attributes for a selected design element involves accessing default attributes for that element. These default attributes may differ based on the type of element and the specific element in question. For example, vector graphic-type elements (e.g. "graphics") may have default attributes defining: size, position, line colour, line weight, line style, fill colour, fill pattern, transparency, and/or other attributes. As another example, raster graphic-type elements (e.g. "photos") may have default attributes defining: size and position. As another example, text-type elements (e.g. "text") may have default attributes defining: size, position, displayed text (e.g. "your text"), font type, font style, font size, font colour, and/or other attributes. As another example, video-type elements (e.g. "videos") may have default attributes defining: size, position, volume, start-time.

In other instances, client application 132 (or server application 114) may be configured to determine default attributes based on additional data.

For example, when determining the size attribute(s) for a given element a scaling factor may be determined and when the element is added to the size of the element determined with reference to this scaling factor (e.g. by applying the scaling factor to a native or default size of the element). As one example, the scaling factor may be determined based on the size of the page that the element is being added to. For example, reference size data may be stored in a multi-dimensional look-up table such as the following:

| Element type/<br>Page size | Image | Video | Text | ... |
|---|---|---|---|---|
| 1920 × 1080 px | A | B | C | |
| 800 × 2000 px | D | E | F | |
| 500 × 500 px | G | H | I | |
| ... | | | | |

In this example, the reference size data for an image element added to a 1920×1080 page is A pixels (which, in this particular example, indicates that the maximum height or width of an image element added to a 1920×1080 page is A pixels) while the reference size data for an image element added to a 500×500 page is G pixels (e.g. a maximum height or width of G pixels). From this table a scaling factor can be calculated in order to uniformly scale the element (i.e. scaled so its aspect ratio is maintained) so that the largest dimension of the element (e.g. its width or height) equals the reference size. In some cases, when calculating the scaling factor a maximum scaling factor of 1 may be set (so that an element is only ever shrunk, but not enlarged).

As another example, if similar elements to the element being added to the design have already been added to the design, the client application 132 (or server application 114) may determine the element size (and/or other attributes) based on those elements. For example, if a user is adding a circle element and has already added one or more circle elements, the size of the new circle element may be based on the size of one or more of the existing circle elements (e.g. the current size of the last circle element that was added, the average size of all circle elements added, or an alternative size based on the existing circle elements).

As another example, client application 132 (or server application 114) may be configured to determine a position size for a given element based on the interaction position associated with the insert element user interaction (as described above). For example, client application 132 may be configured to set the element's position to the interaction position if possible. If this is not possible (for example because doing so will cause some or all of the element to be positioned off-page), client application 132 may base the element's position on the interaction position by calculating position attribute(s) that define a position as close to the interaction position as possible but results in the entirety of the element (at the size determined for the element) to be positioned on-page. In this case, if no interaction position is determined a default position may be used (e.g. centered on the canvas or an alternative default position).

As yet a further example, client application 132 (or server application 114) may be configured to determine one or more colours of a relevant element (e.g. a vector graphic element, text element, or other element that is recolourable) based on various data that may be available. For example, if the design being created is associated with a colour palette, one or more colours of the selected element may be set based on colours in that colour palette. As another example, if the user has previously added similar elements and changed certain colours thereof to particular colours, those particular colours may be used. For example if the user has previously added a circle element and changed its fill colour to a particular colour (e.g. red), the fill colour attribute for the next circle element that is added may be automatically set to the particular colour of the previous circle element (e.g. red).

In the above embodiments certain operations are described as being performed by the client system 130 (e.g. under control of the client application 132) and other operations are described as being performed at the server environment 110. Variations are, however, possible. For example in certain cases an operation described as being performed by client system 130 may be performed at the server environment 110 and, similarly, an operation described as being performed at the server environment 110 may be performed by the client system 130. Generally speaking, however, where user input is required such user input is initially received at client system 130 (by an input device thereof). The user input (or data representative of that input) may be processed by one or more applications running on client system 130 or may be communicated to server environment 110 for one or more applications running on the server hardware 112 to process. Similarly, data or information that is to be output by a client system 130 (e.g. via display, speaker, or other output device) will ultimately involve that system 130. The data/information that is output may, however, be generated (or based on data generated) by client application 132 and/or the server environment 110 (and communicated to the client system 130 to be output).

Furthermore, in certain implementations a computer processing system 200 may be configured (by an application running thereon) to perform the processing described herein entirely independently of a server environment 110. In this case, the application running on that system is a stand-alone application and all instructions and data required to perform the operations described above are stored on that computer processing system 200 (or devices connected thereto).

The flowchart illustrated in the figures and described above defines operations in a particular order to explain various features. In some cases the operations described and illustrated may be able to be performed in a different order to that shown/described, one or more operations may be combined into a single operation, a single operation may be divided into multiple separate operations, and/or the function(s) achieved by one or more of the described/illustrated operations may be achieved by one or more alternative operations.

It will be understood that the embodiments disclosed and defined in this specification extend to alternative combinations of two or more of the individual features mentioned in or evident from the text or drawings. All of these different combinations constitute alternative embodiments of the present disclosure.

The present specification describes various embodiments with reference to numerous specific details that may vary from implementation to implementation. No limitation, element, property, feature, advantage or attribute that is not expressly recited in a claim should be considered as a required or essential feature. Accordingly, the specification and drawings are to be regarded in an illustrative rather than a restrictive sense.

The invention claimed is:

1. A computer implemented method for adding an element to a design, the method including:
    displaying a design canvas in a design preview area of a user interface;
    detecting an insert element user interaction;
    in response to detecting the insert element user interaction, displaying a quick-add graphical user interface (GUI), wherein the quick-add GUI is displayed in the design preview area of the user interface and includes a text input field;
    receiving text query data via the text input field, wherein the text query data is received through user interaction with the text input field;
    detecting a submit query user interaction that submits the text query data, wherein the submit query user interaction is performed after receiving the text query data; and
    in response to detecting the submit query user interaction:
        determining that the text query data is associated with a defined element string, the defined element string being associated with a first design element; and
        in response to determining that the text query data is associated with the defined element string, automatically adding the first design element to the design and displaying the first design element on the design canvas.

2. The computer implemented method of claim 1, wherein in response to receiving the text query data, the method further includes:
    determining that the text query data matches the defined element string; and
    in response to determining that the text query data matches the defined element string, displaying a first element name that is associated with the defined element string in the quick-add GUI as a suggested command.

3. The computer implemented method of claim 1, wherein automatically adding the first design element to the design includes:
    determining one or more first element attributes for the first design element;
    causing a first element record to be generated, the first element record including data identifying the first design element and the one or more first element attributes;
    causing the first element record to be added to design data defining the design; and
    displaying the first design element on the canvas in accordance with the one or more first element attributes.

4. The computer implemented method according to claim 3, wherein determining the one or more first element attributes for the first design element includes determining at least one default first element attribute for the first design element, and wherein the at least one default first element attribute is selected from a group including: a default element size attribute; a default element position attribute; and one or more default element colour attributes.

5. The computer implemented method according to claim 3, wherein determining the one or more first element attributes for the first design element includes determining a position attribute, and the method further includes:
    determining an interaction position on the canvas, the interaction position based on a position of the insert element user interaction; and
    determining the position attribute based on the interaction position.

6. The computer implemented method according to claim 3, wherein determining the one or more first element attributes for the first design element includes determining a size attribute, and the method further includes:
    determining the size attribute based on a design page size.

7. The computer implemented method according to claim 3, wherein determining the one or more first element attributes for the first design element includes determining a size attribute, and the method further includes:
    determining the size attribute based on size data associated with one or more existing design elements that have already been added to the design.

8. The computer implemented method according to claim 3, wherein determining the one or more first element attributes for the first design element includes determining a colour attribute, and the method further includes:
    determining the colour attribute based on colour data associated with one or more existing design elements that have already been added to the design.

9. The computer implemented method according to claim 1, wherein the first design element is selected from a group including: a text element; a line element; an arrow element; a circle element; a square element; a rectangle element; a heart element; a chart element; a star element; a triangle element; a hexagon element; and a pentagon element.

10. The computer implemented method according to claim 1, wherein after displaying the first design element on the design canvas the method further includes automatically ceasing to display the quick-add GUI.

11. The computer implemented method according to claim 1, wherein the method further includes displaying an asset preview area that is separate to the design preview area and is displayed while the design preview area is displayed.

12. The computer implemented method according to claim 11, wherein the asset preview area includes a search control via which a user can submit search data to search for design elements, and wherein the search control is separate to the text input field of the quick-add user interface and the search control is displayed while the text input field of the quick-add user interface is displayed.

13. The computer implemented method according to claim 1, wherein the insert element user interaction is a keyboard shortcut.

14. The computer implemented method according to claim 1, wherein the quick-add GUI is displayed on top of the design canvas.

15. A computer implemented method for adding an element to a design, the method including:
  displaying a design canvas in a design preview area of a user interface;
  detecting an insert element user interaction;
  in response to detecting the insert element user interaction, displaying a quick-add graphical user interface (GUI), wherein the quick-add GUI is displayed in the design preview area of the user interface and includes a text input field;
  receiving text query data via the text input field, wherein the text query data is received through user interaction with the text input field;
  detecting a submit query user interaction that submits the text query data, wherein the submit query user interaction is performed after receiving the text query data; and
  in response to detecting the submit query user interaction:
    determining that the text query data is associated with a search category; and
    in response to determining that the text query data is associated with the search category:
      causing a design element search to be performed based on the search category and the text query data, wherein the design element search identifies one or more search results, and wherein each search result is associated with a design element; and
      displaying previews of the one or more search results in the quick-add GUI.

16. The computer implemented method according to claim 15, further including:
  receiving user input selecting a particular preview, the particular preview associated with a second design element; and
  responsive to receiving the input selecting the particular search preview, adding the second design element to the design.

17. The computer implemented method of claim 16, wherein adding the second design element to the design includes:
  determining one or more second element attributes for the second design element;
  causing a second element record to be generated, the second element record including data identifying the second design element and the one or more second element attributes;
  causing the second element record to be added to design data defining the design; and
  displaying the second design element on the canvas in accordance with the one or more second element attributes.

18. The computer implemented method according to claim 15, wherein the search category is selected from a group including: a photos search category; a graphics search category; a videos search category; and a logos search category.

19. A computer processing system including:
  a processing unit;
  a display; and
  non-transient computer-readable storage medium storing instructions, which when executed by the processing unit, cause the processing unit to perform a computer implemented method for adding an element to a design, the method including:
    displaying, on the display, a design canvas in a design preview area of a user interface;
    detecting an insert element user interaction;
    in response to detecting the insert element user interaction, displaying a quick-add graphical user interface (GUI), wherein the quick-add GUI is displayed in the design preview area of the user interface and includes a text input field;
    receiving text query data via the text input field, wherein the text query data is received through user interaction with the text input field;
    detecting a submit query user interaction that submits the text query data, wherein the submit query user interaction is performed after receiving the text query data; and
    in response to detecting the submit query user interaction:
      determining that the text query data is associated with a defined element string, the defined element string being associated with a first design element; and
      in response to determining that the text query data is associated with the defined element string, automatically adding the first design element to the design and displaying the first design element on the design canvas.

20. A computer processing system including:
  a processing unit;
  a display; and
  non-transient computer-readable storage medium storing instructions, which when executed by the processing unit, cause the processing unit to perform a computer implemented method for adding an element to a design, the method including:
    displaying, on the display, a design canvas in a design preview area of a user interface;
    detecting an insert element user interaction;
    in response to detecting the insert element user interaction, displaying a quick-add graphical user interface (GUI), wherein the quick-add GUI is displayed in the design preview area of the user interface and includes a text input field;
    receiving text query data via the text input field, wherein the text query data is received through user interaction with the text input field;
    detecting a submit query user interaction that submits the text query data, wherein the submit query user interaction is performed after receiving the text query data; and
    in response to detecting the submit query user interaction:
      determining that the text query data is associated with a search category; and
      in response to determining that the text query data is associated with the search category:
        causing a design element search to be performed based on the search category and the text query data, wherein the design element search identifies one or more search results, and wherein each search result is associated with a design element; and
        displaying previews of the one or more search results in the quick-add GUI.

* * * * *